(12) United States Patent
Mallet et al.

(10) Patent No.: US 6,979,994 B2
(45) Date of Patent: Dec. 27, 2005

(54) POWER SUPPLY DEVICE FOR A COMPONENT TESTING INSTALLATION

(75) Inventors: Jean-Pascal Mallet, Saint Just Saint Rambert (FR); Bernard Plantier, Planfoy (FR); Damien Lamarche, Saint Etienne (FR)

(73) Assignee: Credence Systems Corporation, Milpitas, CA (US)

( * ) Notice: Subject to any disclaimer, the term of this patent is extended or adjusted under 35 U.S.C. 154(b) by 16 days.

(21) Appl. No.: 10/466,366

(22) PCT Filed: Jan. 29, 2002

(86) PCT No.: PCT/JB02/00263

§ 371 (c)(1),
(2), (4) Date: Dec. 8, 2003

(87) PCT Pub. No.: WO02/061518

PCT Pub. Date: Aug. 8, 2002

(65) Prior Publication Data

US 2004/0085058 A1 May 6, 2004

(30) Foreign Application Priority Data

Jan. 31, 2001 (FR) .......................................... 01 01366

(51) Int. Cl.$^7$ ............................................. G01R 23/02
(52) U.S. Cl. ................................... 324/76.39; 324/765
(58) Field of Search .............................. 324/142, 158.1, 324/763, 765, 771, 600, 710, 713, 76.11, 76.39; 323/212, 234, 304, 265–273; 714/22; 377/19, 58

(56) References Cited

U.S. PATENT DOCUMENTS

| | | | | |
|---|---|---|---|---|
| 4,016,408 A | * | 4/1977 | Koetzle | 714/22 |
| 4,610,019 A | * | 9/1986 | Richards et al. | 377/58 |
| 6,181,117 B1 | | 1/2001 | Iafrate et al. | 323/269 |

* cited by examiner

*Primary Examiner*—Vincent Q. Nguyen
(74) *Attorney, Agent, or Firm*—Smith-Hill and Bedell

(57) ABSTRACT

A power supply device for an installation for testing electronic components. The power supply device includes a first, high-frequency, supply source, a second, low-frequency, supply source, and a control module. The first, high-frequency, supply source includes a high-frequency amplification stage capable of outputting a first current (i1) for a first time interval. The second, low-frequency, supply source has a low-frequency amplification stage capable of outputting a second current (i2) for a second time interval, the second time interval being longer than the first time interval. The control module is adapted to selectively activate either the first source and then the second source, thereby outputting a current of the order of i1 for a time interval greater than the first time interval or only the first source, thereby outputting a current of the order of i1 for a time interval less than or equal to the first time interval. The control module responds to the needs of an electronic component under test.

37 Claims, 4 Drawing Sheets

POWER SUPPLY DEVICE FOR A COMPONENT TESTING INSTALLATION

CROSS REFERENCE TO RELATED APPLICATION

This is a national stage application filed under 35 USC 371 based on International Application No. PCT/I2002/0263 filed Jan. 29, 2002, and claims priority under 35 USC 119 of French Patent Application No. 01/01366 filed Jan. 31, 2001.

BACKGROUND OF THE INVENTION

The invention relates to the field of nondestructive testing of electronic components. It relates more particularly to the of field of installations for testing such components.

The performance levels of electronic chips, especially of microprocessors, are always being raised. At the present time, the electrical currents that these components are considered to withstand exceed ever increasing thresholds and for ever longer periods.

To perform the tests on such components correctly, power, especially current, supply devices that would allow such currents to be obtained rapidly and for long enough times are desired.

The present invention will improve the situation.

SUMMARY OF THE INVENTION

For this purpose, the invention provides a power supply device for an installation for testing electronic components. The device comprises a first supply source and a second supply source, and a module for the coupled control of the two sources.

According to a general feature of the invention, the first and second sources comprise, respectively:
- a high-frequency amplification stage capable of outputting a first current for a first time interval, and
- a low-frequency amplification stage capable of outputting a second current for a second time interval, longer than the first interval;
- the control module, in order to rapidly reach and to maintain a current of the order of said first current, activates firstly the first source and then the second source.

Advantageously, the control module includes a measurement instrument capable of measuring an electrical parameter as output of the first source, in order to activate the second source depending on the value of said measured parameter. Preferably, the current output by the second source is intended to replace the current output by the first source. Complementarily or alternatively, the control member is designed to activate both sources at once, at least for a chosen transient period, while maintaining an approximately constant delivered current.

Preferably, the first source comprises a high-frequency linear amplifier and the second source comprises a PWM or switch mode power supply, so that the first source has a supply current leading edge steeper than the supply current leading edge of the second source, allowing the device according to the invention to deliver about 200 amps in less than 500 nanoseconds, preferably 200 nanoseconds.

Advantageously, the device furthermore includes a third source suitable for delivering a current, preferably a measurement current, that is substantially lower than the current delivered by the second source.

BRIEF DESCRIPTION OF THE DRAWINGS

Other advantages and features of the invention will become apparent on reading the detailed description below and on examining the drawings in which.

DETAILED DESCRIPTION OF THE INVENTION

The detailed description below and the appended drawings contain mostly elements of a certain character. They may not only serve to make the present invention more clearly understood, but also contribute to its definition, as the case may be.

The present invention is described below within the context of an installation for testing components. However, other applications may be envisioned, especially supply devices for endurance tests, inspection of incoming goods, laboratory apparatus, etc.

Figure 1:
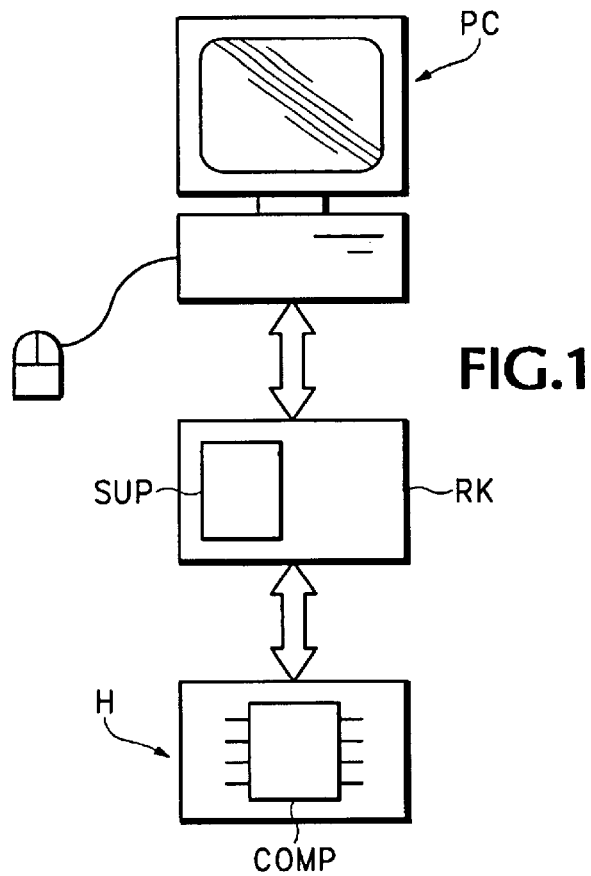
FIG. 1 shows an installation for testing electronic components COMP.

In the field of testing, whether in production or in characterization, in particular of hybrid (analogue/digital) CMOS components of very large-scale integration, and more especially components operating with high currents, such as microcontrollers or microprocessors, a test installation (FIG. 1) generally comprises:
- a computer or any other workstation platform, which is the workstation PC allowing an operator to prepare, by means of suitable software (such as the software developed by the Applicant and sold under the brand name ASAP), sequences of tests that it intends to carry out on the electronic components, for example at the end of a manufacturing line, so as to verify the proper operation thereof;
- an electronic rack RK connected to the computer via a central control unit (not shown) and capable of generating the sequence of tests prepared by the operator and of comparing the responses obtained with the responses provided in advance as regards operation of the components according to specification; and
- a measurement head H in which the electronic components COMP to be tested are placed.

Moreover, the electronic rack RK includes a supply subassembly SUP, consisting of as many supply circuits as needed to supply the components under test. Each supply circuit is designed to deliver to the electronic components COMP a supply current within a given range at a nominal bias voltage, for example +3 volts.

More precisely, the components to be tested here are supplied with voltage, but it is more advantageous to check their "supply" current. This is why "current supply sources" will be described below.

Depending on the type of component to be tested, it is necessary to provide power supply circuits in the block SUP that are capable of outputting suitable electrical currents.

With the recent technological developments in microelectronics, components such as microprocessors or microcontrollers are of ever increasing performance. In particular, they are supposed to consume high currents (of the order of one hundred amps) in the form of sudden variations that are added, as the case may be, to a steady current (which may also be around one hundred amps). These current variations are in fact rapid, typically of the order of a few nanoseconds.

The power supplies of the prior art have never had to deliver such high currents in so short a time. For microprocessors whose working frequency is now within the GHz range, it is necessary to provide power supplies in test installations that are capable of delivering such currents in such short times.

More precisely, the supply voltage for the component to be tested must be controlled and correctly regulated so that the tests are effective, even if the current variations are rapid and substantial. This control is advantageously effected by controlling the voltage measured directly at the terminals of the component.

In the test circuits of the prior art, it is general practice to use linear amplifiers, which are sometimes of the high-frequency type (HFLA). These linear amplifiers allow the voltage to be regulated, while delivering a current within a time interval of the order of one microsecond. However, the efficiency of this type of power supply is relatively low (about 50%). Moreover, if the desired currents are too high (a few tens of amps to about one hundred amps), such currents can be output only for restricted periods (only for a few tens of microseconds).

Other known power supply sources, operating more at low frequency, relate particularly to switch mode or PWM (pulse width modulation) power supplies. Although such a power supply has a better efficiency (about 85%), it is noisy, slow (10 to 50 KHz) and very difficult to regulate at low voltage.

The preferred solution in the recent prior art consists of the use of HFLA power supplies, especially for its speed of reaction. However, to test components that accept high currents, it would be necessary to provide a cooling device as a consequence, something which, in terms of performance, miniaturization and cost, becomes prohibitive.

The Applicant was then faced with the problem of providing a high-current power supply device whose performance makes it possible to maintain a very stable voltage applied to the components to be tested, under test conditions requiring very large current surges. In addition, this supply device, including the system for connecting the component to be tested, must preferably comprise a minimum number of resistors inductors liable to limit the dynamic performance of the device. The supply device is advantageously placed as close as possible (in terms of distance) to the component to be tested.

Typically, what is desired is a supply device capable of delivering about 200 amps for a supply voltage of 0.4 to 3 volts, with a maximum rate of response within the tens of nanoseconds range.

A supply device according to the invention will now be described with reference to FIG. 2.

In general, the device comprises a first source of current i1, formed by a high-frequency linear amplifier HFLA, and a low-frequency second source LF of current i2.

The low-frequency supply LF of the device preferably comprises two blocks PWM and LCM that may be selected in order for one or other to supply the component COMP. The source PWM is capable of delivering relatively high currents in a few microseconds. The source LCM comprises a linear amplifier and delivers small currents. Preferably, these small currents correspond to measurement currents typically of less than 5 amps, which make it possible to achieve great accuracy because of a narrow range.

In normal operation, a supply voltage V is applied to the circuit HFLA, which rapidly reacts, delivering a current i1 in a few hundred nanoseconds, typically 200 nanoseconds. A sensor C1 (FIG. 4) measures the current that the block HFLA delivers. This sensor is connected to a control module CON (FIG. 4) that controls the supply voltage U of the block LF.

Typically, if the measurement of i1 indicates that a further supply of current i2 is needed, the block LF is actuated and delivers the current i2, this being added firstly to the current i1, the sum of these two currents then supplying the component COMP to be tested. Secondly, the block LF alone supplies the component COMP to be tested, without the current i1.

On the other hand, if the measurement of i1 indicates that the current peak delivered by the block H FLA is sufficient to supply the component COMP, the second source (block LF) remains inhibited (U=0 volt).

Figure 2:
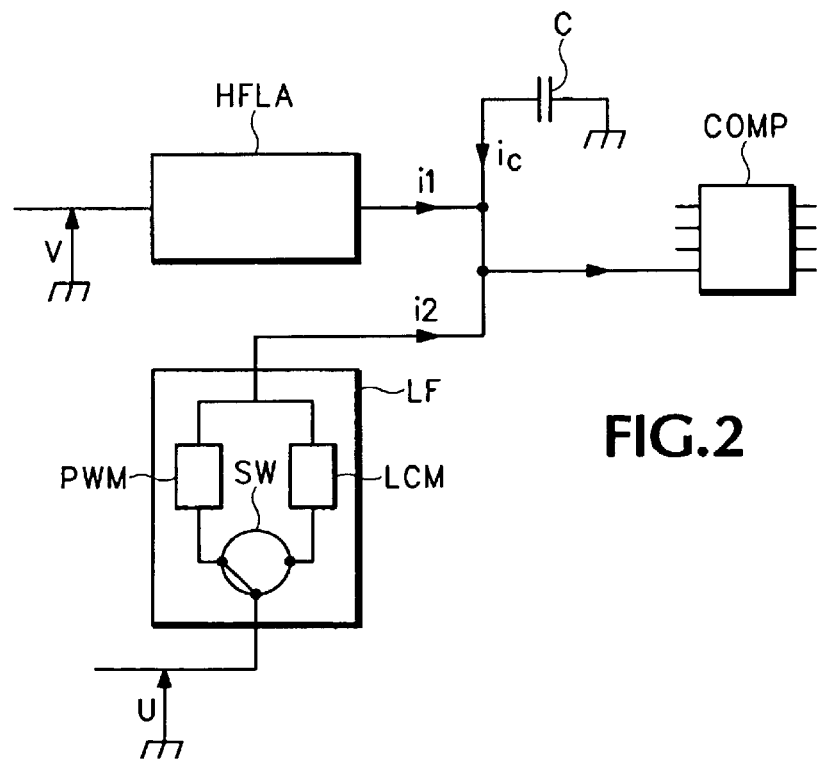
FIG. 2 shows very schematically a power supply device for this installation.

FIG. 2 also shows an accumulator circuit (or capacitor C), normally supplied and charged by the supply device formed from the two sources HFLA and LF. When a variation in current occurs within the component COMP, the accumulator circuit discharges and thus supplies the component COMP with current $i_c$. Thus, the component COMP may be supplied simultaneously by the capacitor C, by the first source HFLA and by the second source LF. In FIG. 2, the accumulator circuit is shown schematically in the form of a capacitor C, but the reader may refer to FIG. 5 to find a detailed example of the construction of this circuit C.

Present-day components such as microprocessors require, during their operation, very high supply currents (from 100 to 200 amps), but also low supply currents for example when a microprocessor of a computer has to operate in what is called "standby" mode. In this case, the supply currents are around 0.5 to 1 amp.

As long as the current demand by the test component does not exceed a threshold value, for example 5 amps, the block LCM may be selected via the switch SW (in the example shown schematically in FIG. 2).

On the other hand, if the current demand exceeds this 5 amp value, the block PWM is selected via the switch SW. In an advantageous embodiment, the switching between the block PWM and the block LCM is controlled on the basis of a measurement of the current i1 output by the high-frequency block HFLA.

If the measured value of i1 is less than 5 amps, it is the block LCM that is activated and the current i2 is delivered within a range that corresponds to this value. However, if the measured value of i1 is greater than 5 A, it is the block PWM that is activated in order to deliver a current i2 of greater than 5 A.

The respective reactions of the block HFLA, the block PWM and the capacitor C of the supply device with a supply demand at a voltage V will now be described with reference to FIG. 3. In a few hundred nanoseconds, a current i1 delivered by the high-frequency block HFLA goes from 0 to more than 100 amps (in 200 nanoseconds in the example shown). The current i1 output by the block HFLA falls over a few microseconds and the block PWM, over this time, outputs the current i2. It should be noted in FIG. 3 that the leading edge of the current i2 is much steeper than the leading edge of the current i1. In addition, the capacitor C discharges and delivers the current $i_c$.

Figure 3:
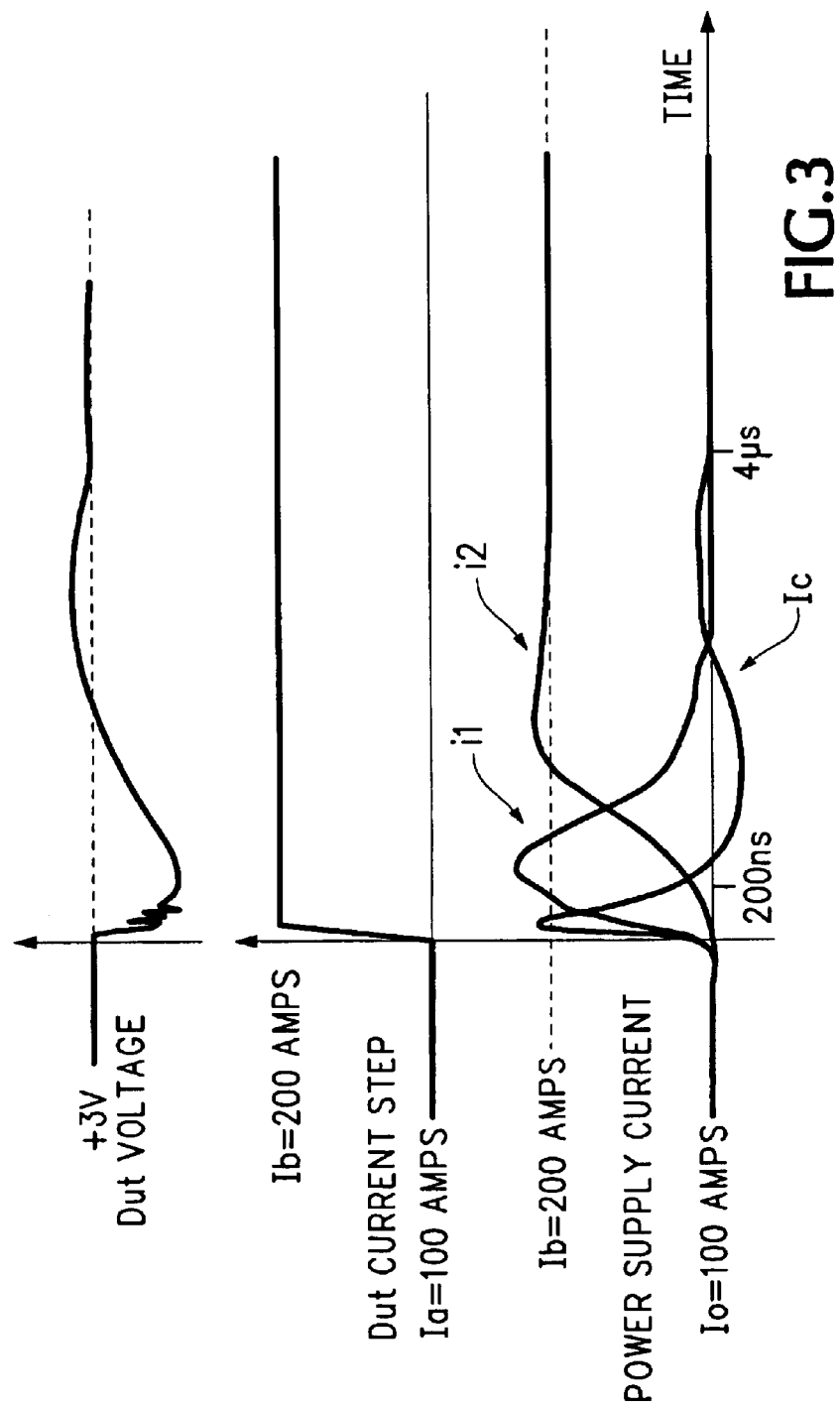
FIG. 3 shows the time variations of the currents delivered respectively by the elements of the device shown in FIG. 2, and the time variation of the voltage applied to the components to be tested (DUT Voltage)

Referring to FIG. 3 (the graph entitled "Power supply current"), the sum of the three currents i1, i2 and $i_c$ corresponds to the current demanded by the component COMP. This demanded current (shown by the graph in FIG.

3 entitled "DUT current step") represents a change in current of about 100 amps in a few hundred nanoseconds, compared with a steady current that may be equal to 100 amps.

The voltage actually applied to and measured at the component to be tested stabilizes in a few microseconds (the variation shown in the graph entitled "DUT voltage" of FIG. 3). By controlling the currents i1, i2 output by the current sources, it is thus possible to maintain a voltage at the terminals of the component COMP whose stability needs the required conditions. The few pseudo-oscillations after the voltage peak are mainly due to the parasitic inductances and capacitances of the circuit.

A preferred embodiment of the supply device according to the invention will now be described in greater detail with reference to FIG. 4.

The feedback control of the supply voltage is effected by detecting the voltage on the component to be tested and by comparing it with the programmed supply voltage that is desired. The result of this comparison $V_{err}$ is applied to the block HFLA. This block comprises a broadband linear amplifier with a structure of the type referred to as "push/pull", which allows a very rapid response. It is as a function of the voltage error signal $V_{err}$ that the linear amplifier HFLA is controlled. The output current of the block HFLA is measured by the sensor C1 and then preferably applied to a low-pass amplifier before being compared with a 0-amp reference value. The result of this comparison is sent to the module PWM, which delivers the current i2, replacing the current i1.

Preferably, the block PWM comprises an MPBS (multiphase buck switcher) converter that is regulated in "mean current" mode.

Figure 5:
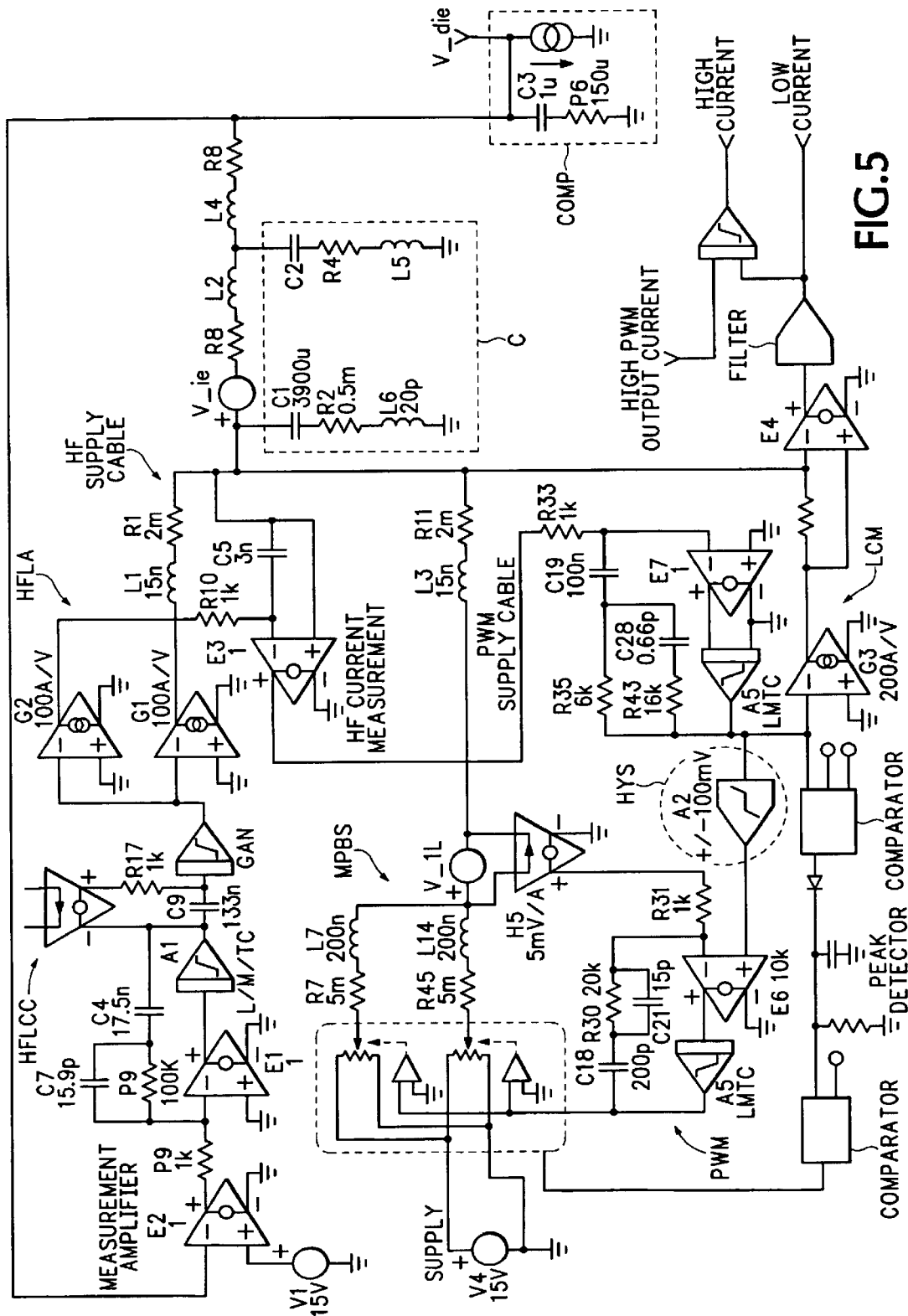
FIG. 5 shows in detail the circuits provided for the device in this preferred embodiment.

Referring to FIG. 5, the block MPBS is regulated using two feedback loops:
 one feedback loop, current-regulated, is based on the detection of a mean output current;
 the other feedback loop consists in measuring the output current of the block HFLA and thus controls the output current of the block PWM by, when appropriate, cancelling the current output by the block HFLA.

The block PWM delivers the corresponding mean current i2 instead of the block HFLA, which delivers the current i1. Thus, after a few hundred nanoseconds of activation of the block HFLA, the block PWM takes the place of the high-frequency block HFLA.

To obtain a very rapid current response, when the supply for the component COMP has to deliver a sudden variation, a measurement of the current near the component to be tested is used. In a preferred embodiment, this measurement is carried out by the block HFLCC in FIG. 5, this block allowing the charging current to be feedback-controlled. In parallel with the block PWM, the block LCM comprises a linear amplifier designed to deliver a current of up to 5 amps. This amplifier LCM makes it possible to take low-current measurements within a broadband response and can thus be used as low-current generator for carrying out tests for verifying the continuity of the connection to the component to be tested.

Referring to FIG. 5, the block LCM delivers a current whose value may saturate to 5 amps. A hysteresis detector HYS is connected, on the one hand, to the block LCM and, on the other hand, to the control block of the block PWM. Thus, if the value of the current delivered by the block LCM is greater than 5 amps, the block PWM is activated. On the other hand, if this current value is less than 5 amps (and therefore not saturated), the block PWM is inhibited.

A person skilled in the art will find in FIG. 5 further technical constructional details of the device in the embodiment described above.

Thus, by controlling the current delivered, the voltage is regulated preferably as follows.

The high-frequency linear amplifier delivers a supply current for a few tens of microseconds, and then this current drops. Next, the amplifier PWM delivers the same mean supply current for the component to be tested, using, as the case may be, a discharge current from the capacitor C which is connected to the component COMP and which discharges. A second linear amplifier capable of delivering a maximum current, for example of 5 amps, is used for measuring the low currents.

Of course, the present invention is not limited to the embodiment described above. It extends to other, alternative embodiments.

Figure 4:
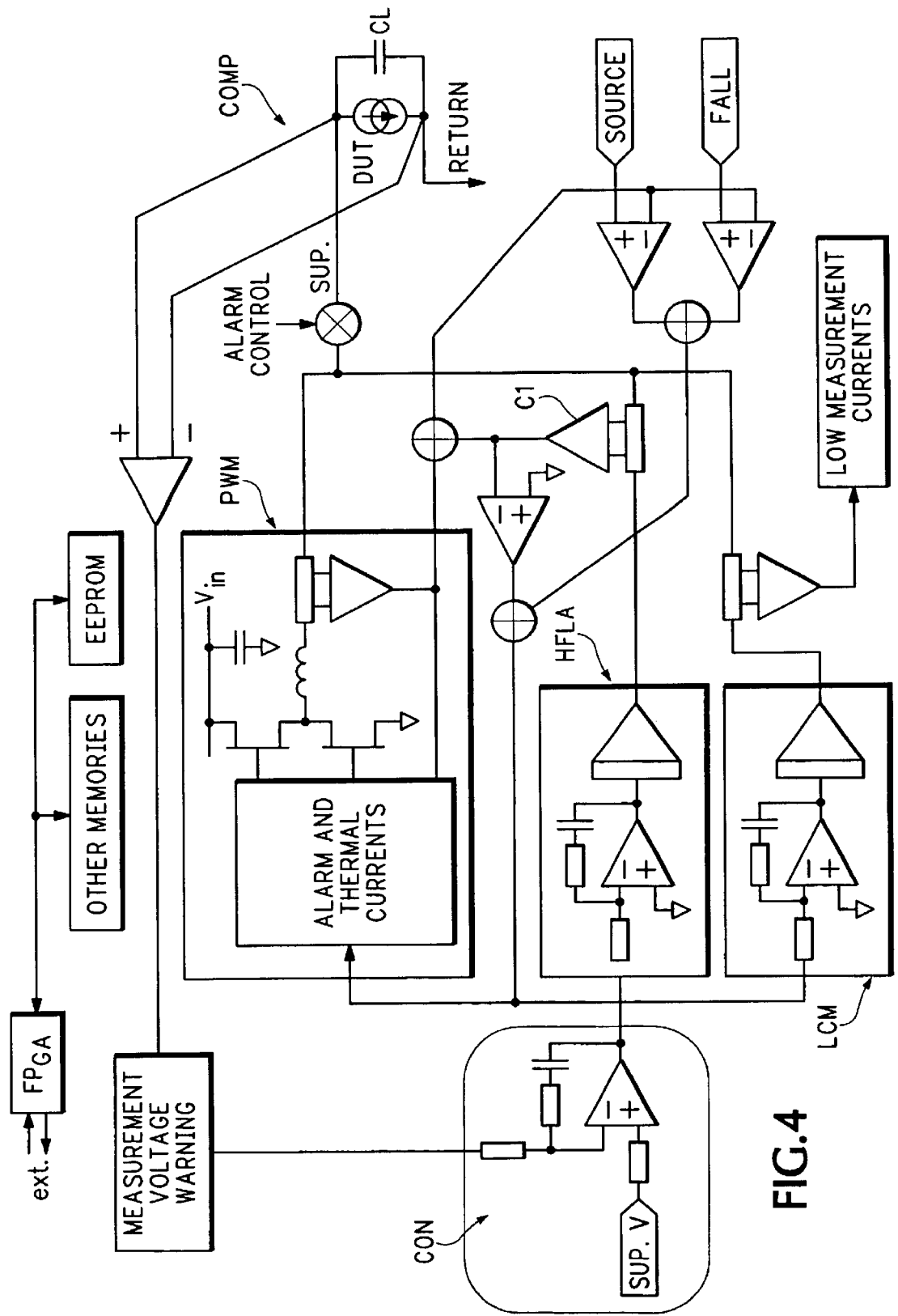
FIG. 4 shows in greater detail the device in a preferred embodiment of the invention.

In particular, the embodiment of the invention is not limited to the structure of the circuits shown in FIGS. 4 and 5.

What is claimed is:

1. A power supply device for an installation for testing electronic components, the power supply sevice comprising:
 a first, high-frequency, supply source having a high-frequency amplification stage capable of outputting a first current (i1) for a first time interval;
 a second, low-frequency, supply source having a low-frequency amplification stage capable of outputting a second current (i2) for a second time interval, the second time interval being longer than the first interval; and
 a control module for controlling the first and second supply sources,
 wherein the control module has a first mode of operation in which it activates the first source, thereby outputting a current for a time interval less than or equal to said first time interval, and a second mode of operation in which it activates the first source and subsequently activates the second source, thereby outputting a current for a time interval greater than said first time interval.

2. The device of claim 1, wherein the control module includes a measurement instrument capable of measuring the first current and wherein the control module is designed to activate the second source according to the value of said first current.

3. The device of claim 1, wherein the second source has an input connected to the output of the first source.

4. The device of claim 1, wherein the first source comprises a high-frequency linear amplifier.

5. The device of claim 1, wherein the second source comprises a switch mode power supply.

6. The device of claim 1, wherein in the second mode of operation the control module activates the second source before the first time interval ends.

7. The device of claim 1, wherein the device further comprises an accumulator circuit connected to an electric component under test and wherein the first and second sources are connected to the accumulator circuit.

8. The device of claim 7, wherein in the first and second modes of operation said accumulator circuit is adapted to supply said electronic component for at least part of said first time interval.

9. The device of claim 7, wherein the accumulator circuit comprises at least one capacitor and the first source is connected to charge the capacitor.

10. The device of claim 7, wherein the control module is designed:
 to activate the first source for recharging the accumulator circuit and for delivering the current to the component to be tested; and
 to activate the second source and deactivate the first source.

11. The device of claim 1, wherein in the second mode of operation the control module deactivates the first source substantially after activating the second source.

12. The device of claim 1, wherein the first source is designed to output a current having a leading edge that is steeper than the leading edge of current output by the second source.

13. The device of claim 1, wherein the current delivered to an electronic component under test will reach about 200 amps in less than 500 nanoseconds.

14. The device of claim 1, wherein the current delivered to an electronic component under test will reach about 200 amps in less than 200 nanoseconds.

15. The device of claim 1, further comprising a third source adapted for outputting a third current (i3) substantially less than the second current (i2).

16. The device of claim 15, wherein the third current is a measurement current.

17. The device of claim 15, further comprising a switching element between said third source and the second source, suitable for selectively activating the second source or the third source according to the first current.

18. The device of claim 1, wherein the device further comprises an accumulator circuit for connection to an electronic component under test and wherein the first and second sources are connected to the accumulator circuit, in the first and second modes of operation said accumulator circuit is adapted to supply said electronic component for at least part of said first time interval, and during the second mode of operation, the device will respond a requirement by said electronic component for additional current by:
   initially supplying a majority of the additional current to the electronic component via the accumulator circuit,
   subsequently supplying a majority of the additional current to the electronic component via the first supply source,
   subsequently supplying a majority of the additional current to the electronic component via the second supply source, and
   finally supplying all of the current required by the electronic component via the second supply source.

19. An installation for testing electronic components, comprising a power supply device having:
   a first, high-frequency, supply source having a high-frequency amplification stage capable of outputting a first current (i1) for a first time interval;
   a second, low-frequency, supply source having a low-frequency amplification stage capable of outputting a first current (i2) for a second time interval, the second time interval being longer than the first time interval; and
   a control module for controlling the first and second supply sources,
   wherein the control module has a first mode of operation and a second mode of operation in which it activates the first source and subsequently activates the second source, thereby outputting a current for a time interval greater than said first time interval.

20. The installation of claim 19, wherein the control module's first mode of operation comprises activating the first source, thereby outputting a current for a time interval less than or equal to said first time interval.

21. The device of claim 19, wherein the control module includes a measurement instrument capable of measuring the first current and wherein the control module is designed to activate the second source to the value if said first current.

22. The device of claim 19, wherein the second source has an input connected to the output of the first source.

23. The device of claim 19, wherein the first source comprises a high-frequency linear amplifier.

24. The device of claim 19, wherein the second source comprises a switch mode power supply.

25. The device of claim 19, wherein in the second mode of operation the control module activates the second source before the first time interval ends.

26. The device of claim 19, wherein the device further comprises an accumulator circuit for connection to an electronic component under test and wherein the first and second sources are connected to the accumulator circuit.

27. The device of claim 26, wherein in the first and second modes of operation said accumulator circuit is adapted to supply said electronic component for at least part of said first time interval.

28. The device of claim 26, wherein the accumulator circuit comprises at least one capacitor and the first source is connected to charge the capacitor.

29. The device of claim 26, wherein the control module is designed:
   to activate the first source for recharging the accumulator circuit and for delivering the current to the component to be tested; and
   to activate the second source and deactivate the first source.

30. The device of claim 19, wherein in the second mode of operation the control module deactivates the first source substantially after activating the second source.

31. The device of claim 19, wherein the first source is designed to output a current having a leading edge that is steeper than the leading edge of current output by the second source.

32. The device of claim 19, wherein the current delivered to an electronic component under test will reach about 200 amps in less than 500 nanoseconds.

33. The device of claim 19, wherein the current delivered to an electronic component under test will reach about 200 amps in less than 200 nanoseconds.

34. The device of claim 19, further comprising a third source adapted for outputting a third current (i3) substantially less than the second current (i2).

35. The device of claim 34, wherein the third current is a measurement current.

36. The device of claim 34, further comprising a switching element between said third source and the second source, suitable for selectively activating the second source or the third source according to the first current.

37. The device of claim 19, wherein the device further comprises an accumulator circuit for connection to an electronic component under test and wherein the first and second sources are connected to the accumulator circuit, in the first and second modes of operation said accumulator circuit is adapted to supply said electronic component for at least part of said first time interval, and during the second mode of operation, the device will respond a requirement by said electronic component for additional current by:
   initially supplying a majority of the additional current to the electronic component via the accumulator circuit,
   subsequently supplying a majority of the additional current to the electronic component via the first supply source,
   subsequently supplying a majority of the additional current to the electronic component via the second supply source, and
   finally supplying all of the current required by the electronic component via the second supply source.

* * * * *

UNITED STATES PATENT AND TRADEMARK OFFICE
CERTIFICATE OF CORRECTION

PATENT NO. : 6,979,994 B2  
APPLICATION NO. : 10/466366  
DATED : December 27, 2005  
INVENTOR(S) : Jean-Pascal Mallet, Bernard Plantier and Damien Lamarche It is certified that error appears in the above-identified patent and that said Letters Patent is hereby corrected as shown below:

<u>Column 6,</u>  
Line 20, "sevice" should be -- device --.  
Line 54, "connected" should be -- for connection --.  
Line 67, "delivering current" should be -- delivering the current --.

<u>Column 7,</u>  
Line 50, "first time interval" should be -- first interval --.  
Line 66, "source to" should be -- source according to --; and "value if" should be -- value of --.

Signed and Sealed this

Fourth Day of July, 2006

JON W. DUDAS  
*Director of the United States Patent and Trademark Office*